US012707875B2

(12) United States Patent
Chen et al.

(10) Patent No.: US 12,707,875 B2
(45) Date of Patent: Aug. 11, 2026

(54) METHOD FOR SYNTHESIZING PEROVSKITE PRECURSOR SOLUTION OF FORMAMIDINE-BASED IONIC LIQUID, CELLDEVICE, AND SOLAR CELL

(71) Applicant: NANJING TECH UNIVERSITY, Nanjing (CN)

(72) Inventors: Yonghua Chen, Nanjing (CN); Lingfeng Chao, Nanjing (CN); Yuqian Xie, Nanjing (CN); Yingdong Xia, Nanjing (CN); Wei Huang, Nanjing (CN)

(73) Assignee: NANJING TECH UNIVERSITY, Nanjing (CN)

( * ) Notice: Subject to any disclaimer, the term of this patent is extended or adjusted under 35 U.S.C. 154(b) by 0 days.

(21) Appl. No.: 19/218,946

(22) Filed: May 27, 2025

(65) Prior Publication Data

US 2025/0287825 A1 Sep. 11, 2025

Related U.S. Application Data

(63) Continuation of application No. PCT/CN2023/113153, filed on Aug. 15, 2023.

(51) Int. Cl.
*H10K 71/12* (2023.01)
*H10K 30/50* (2023.01)
(Continued)

(52) U.S. Cl.
CPC ............. *H10K 71/12* (2023.02); *H10K 30/50* (2023.02); *H10K 71/40* (2023.02); *H10K 85/50* (2023.02)

(58) Field of Classification Search
CPC ........ H10K 71/12; H10K 30/50; H10K 71/40; H10K 85/50; H10K 30/10; H10K 30/151;
(Continued)

(56) References Cited

FOREIGN PATENT DOCUMENTS

CN 114141953 A * 3/2022 ............ H10K 85/60
CN 114267798 A * 4/2022

OTHER PUBLICATIONS

Machine Translation, CN '798 (Year: 2022).*
Machine Translation, CN '953 (Year: 2022).*

* cited by examiner

*Primary Examiner* — Michael G Miller
(74) *Attorney, Agent, or Firm* — HOWARD M COHN and Associates, LLC

(57) ABSTRACT

Disclosed are a method for synthesizing a perovskite precursor solution of a formamidine-based ionic liquid, a cell device, and a solar cell. The method includes: adding an organic sodium salt and formamidine hydrochloride to ethanol, respectively, stirring to obtain a formamidine hydrochloride solution and a sodium alkyl carboxylate solution; dropwise adding the formamidine hydrochloride solution to the sodium alkyl carboxylate solution, stirring the mixed solution; filtering the reacted mixed solution and extracting a filtrate, performing rotary evaporation to remove ethanol, and performing oscillating washing; performing secondary filtration, extracting a filtrate, and performing rotary evaporation to remove the organic solvent, to obtain an organic acid formamidine ionic liquid; and dissolving lead iodide and formamidine hydriodide into the organic acid formamidine ionic liquid for reaction to obtain the perovskite precursor solution of the formamidine-based ionic liquid. The method solves the problem of poor phase stability of $FAPbI_3$ perovskite in humidity environments.

13 Claims, 3 Drawing Sheets

$$RCOONa + Cl^{-}\,H_3N^{+}CH{=}NH \xrightarrow[24\ h]{\text{Ethanol solution}} RCOO^{-}\,H_3N^{+}CH{=}NH + NaCl$$

(51) Int. Cl.
*H10K 71/40* (2023.01)
*H10K 85/50* (2023.01)

(58) Field of Classification Search
CPC ...... H10K 30/40; H10K 71/15; Y02E 10/549; C07C 51/41; C07C 53/122; C07C 257/12
See application file for complete search history.

$$R{-}C(=O){-}ONa \;+\; \overset{-}{Cl}\;\overset{+}{H_3N}{-}CH{=}NH \xrightarrow[24\ h]{\text{Ethanol solution}} R{-}C(=O){-}\overset{-}{O}\;\overset{+}{H_3N}{-}CH{=}NH \;+\; NaCl$$

METHOD FOR SYNTHESIZING PEROVSKITE PRECURSOR SOLUTION OF FORMAMIDINE-BASED IONIC LIQUID, CELLDEVICE, AND SOLAR CELL

TECHNICAL FIELD

The present disclosure belongs to the technical field of photoelectric materials, and particularly relates to a method for synthesizing a perovskite precursor solution of a formamidine-based ionic liquid, a cell device, and solar cell.

BACKGROUND

Ionic liquid is a kind of salt consisting of cations and anions and being in a liquid state at room temperature, and has stable properties, weak volatility, and has a stronger dissolving capacity to some halides of inorganic metals. Meanwhile, ionic liquid also has excellent designability and thus can meet various requirements via the design of cations and anions.

Currently, as a direct bandgap semiconductor having ionic properties, hybrid organic-inorganic perovskite has been extensively studied and concerned due to its advantages such as excellent photoelectric properties and preparation via a solution process. With the continuous optimization of perovskite and correlated materials, the photoelectric conversion efficiency of the perovskite solar cell has been promoted rapidly; the current efficiency certified in the world has been up to 25.8% and has already compared favorably with that of the silicon-based solar cell.

The biggest advantage of the perovskite solar cell is that batteries can be processed via a solution process. The selection for a solution is limited to lead halide salts; and in the large-scale deposition technologies, the lead halide salts are slightly dissolved or completely insoluble in most solvents. In addition, during the preparation of the perovskite solar cell, the solvent is crucial to control the crystallization of perovskite and crystal growth. However, efficient perovskite solar cells are still prepared by aprotic solvents having a high boiling point and polarity such as DMF, DMSO, GBL, and other solution techniques. Most of these solvents are highly toxic and need to be controlled strictly in storage and thus, very easily lead to accidents. Moreover, an anti-solvent process has been adopted in most of the current efficient perovskite solar cells. However, anti-solvents are always some volatile organic solvents with a relatively strong toxicity such as chlorobenzene, diethyl ether and toluene. What's more, it is hard to control the anti-solvent process during the preparation of perovskite films, and the controllable time window is very narrow. Therefore, the anti-solvent process has a poor repeatability in the preparation of high-quality perovskite films, particularly, there is a poor repeatability among different research groups and even among different people in the same research group. Anti-solvents induce crystallization via volatilization during the preparation process; thus, the preparation environment and atmosphere are also crucial. Therefore, the problems of solvent treatment and toxicology are great challenges to the commercialized development of perovskite solar cells.

Recently, ionic liquid, as a solvent, shows its great advantages in perovskite solar cells, for example, the ionic liquid with methylamine as the cation such as methylammonium formate (MAFa), methylammonium acetate (MAAc), methylammonium propionate (MAPa). However, the methylamine-based ionic liquid will affect the components and structure of the crystal in the preparation of non-methylamino perovskite solar cells; especially, in the preparation of $FAPbI_3$ perovskite prone to phase transformation, the methylamine-based ionic liquid will cause the blue shift of band gap, thus affecting the performance.

SUMMARY

The examples of the present disclosure provide a method for synthesizing a perovskite precursor solution of a formamidine-based ionic liquid, including

- adding an organic sodium salt and a formamidine hydrochloride to ethanol, respectively, stirring and dissolving to obtain a formamidine hydrochloride solution and a sodium alkyl carboxylate solution;
- dropwise adding the formamidine hydrochloride solution to the sodium alkyl carboxylate solution, and stirring a mixed solution at 25-60° C. for reaction for 24-36 h;
- filtering the reacted mixed solution and extracting a filtrate, performing rotary evaporation on an obtained primary filtrate to remove a solvent ethanol, and performing oscillating washing with an organic solvent for 25-35 min;
- performing secondary filtration on a washed solution and extracting a filtrate;
- performing rotary evaporation on an obtained secondary filtrate to remove the organic solvent, to obtain an organic acid formamidine ionic liquid; and
- dissolving lead iodide and formamidine hydriodide into the organic acid formamidine ionic liquid for reaction for at least 5 h at 40-80° C. to obtain the perovskite precursor solution of a formamidine ionic liquid.

Optionally, a molar ratio of the organic sodium salt to the formamidine hydrochloride is 1:1.5-2.5.

Furthermore, the method also includes:

- adding the obtained organic acid formamidine ionic liquid to ethanol for dissolving, removing the ethanol via rotary evaporation repeatedly to obtain a pure product formamidine alkylcarboxylate ionic liquid.

Optionally, the method further includes:

- a molar ratio of a mixture of the organic sodium salt and the formamidine hydrochloride to the ethanol is 1:5-8.

Optionally, the organic sodium salt is at least one of sodium alkyl carboxylate, sodium propionate, or sodium butyrate.

The examples of the present disclosure further provide a method for preparing a perovskite solar cell device, including:

- cleaning a conductive glass substrate, spin-coating an electron transport material onto the conductive glass substrate, and spin-coating the aforesaid perovskite precursor solution of a formamidine-based ionic liquid obtained by the preparation method onto an electron transfer layer of the conductive glass substrate, and annealing to form a formamidine-based perovskite film;
- spin-coating a hole transport layer material onto the formamidine-based perovskite film to obtain a hole transport layer, and depositing a modified layer and a metal electrode onto the hole transport layer via vacuum evaporation.

Optionally, the preparation of the electron transfer layer further includes:

- mixing $SnO_2$ with deionized water in a mass ratio of 1:3-7 to obtain an electron transfer layer material, a $SnO_2$ solution;

spin-coating the $SnO_2$ solution on a conductive substrate for 20-40 s at 3500-4500 r/min by a spin coater for film forming, and annealing at 120-180° C. for at least 30 min; and performing UV-ozone treatment on an annealed conductive substrate spin-coated with the electron transfer layer for at least 10 min.

Optionally, the preparation of the hole transport layer further includes:

dissolving Spiro-OMeTAD into chlorobenzene, stirring and adding an acetonitrile solution of lithium bis(trifluoromethylsulfonyl)imide and 4-tert-butylpyridine to form the hole transport layer material; and spin-coating the hole transport layer material on a surface of an FAPbIsactive layer at 3500-4500 r/min for 20-40 s for film forming, and performing oxidization in the air for at least 24 h.

Optionally, the modified layer is $MoO_3$ having a thickness of 3-7 nm, and the metal electrode is Au or Ag having a thickness of 80-120 nm.

The examples of the present disclosure further provide a solar cell, including the aforesaid perovskite solar cell device.

The method for synthesizing a perovskite precursor solution of a formamidine-based ionic liquid provided in the examples of the present disclosure is applied in the preparation of $FAPbI_3$ perovskite films; such a process is completed in air, which can achieve the preparation of the pure component $FAPbI_3$ perovskite film in the air via a one-step process, thereby solving the problem of poor phase stability of $FAPbI_3$ perovskite in humidity environments. The $FAPbI_3$ perovskite film prepared by the method has homogeneous and compact crystallization, and stable components. The preparation process is low in cost, simple in operation, operable at low temperature, and easy to achieve large-area production, which is thus of great significance to the large-scale production of high-efficiency perovskite solar cells in the future.

BRIEF DESCRIPTION OF DRAWINGS

To specify the technical solutions in the examples of the present disclosure more clearly, the accompanying drawings required in the description of the examples will be introduced briefly. Obviously, the depicted accompanying drawings below merely show some examples of the present disclosure. Those skilled in the art could further obtain other drawings according to these accompanying drawings without any inventive effort.

DETAILED DESCRIPTION

The technical solutions in the examples of the present disclosure will be specified clearly and integrally in combination with the accompanying drawings of the present disclosure such that those skilled in the art understand the solutions of the present disclosure better.

Example 1

1, Sodium propionate and formamidine hydrochloride were respectively added to a single-neck flask containing ethanol, and stirred at room temperature for 24 h to be dissolved completely, and then the completely dissolved formamidine hydrochloride was dropwise added to a single-neck flask containing sodium propionate; the mixed solution in the single-neck flask was subjected to magnetic stirring at 25-60° C. for 24-36 h, and reaction was stopped.

Figures 1, 2:
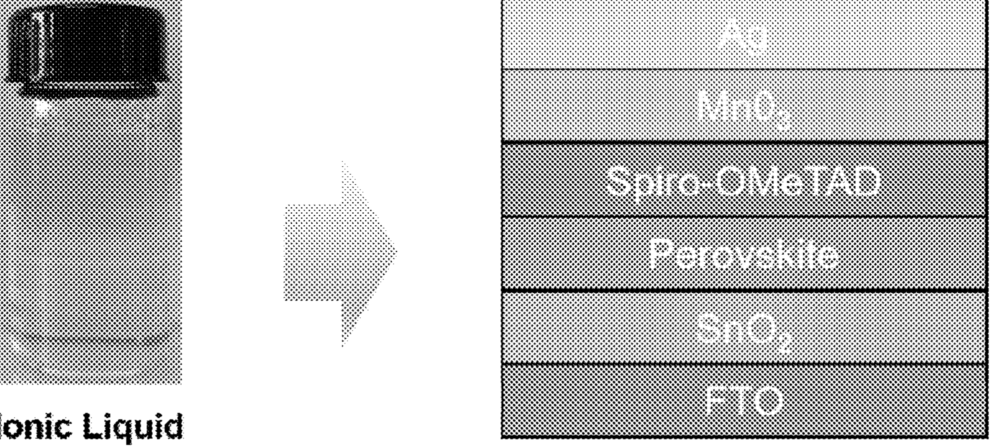
FIG. 1 is a picture showing a real product of a formamidine alkylcarboxylate ionic liquid provided in the examples of the present disclosure.
FIG. 2 is a chemical equation provided by the examples of the present disclosure.

2, The reaction liquid obtained in step 1 was subjected to first filtration, and the filtered primary filtrate was subjected to rotary evaporation to remove the solvent ethanol, and then subjected to oscillating washing with acetone or benzene for 20-35 min, and the washed solution was subjected to secondary filtration to remove the excessive solid; afterwards, the filtered secondary filtrate was subjected to rotary evaporation to remove the solvent acetone or benzene, to obtain the required formamidine propionate ionic liquid, as shown in FIG. 1.

3, 291.33 mg lead iodide and 108.67 mg formamidine hydriodide were weighed and dissolved into 1 ml of a formamidinium propionate ionic liquid solvent; the molar ratio was 1:1 and the concentration was 300-600 mg/ml, and the configured precursor solution was reacted for 5 h at 60° C., as shown in the reaction formula of FIG. 2.

4, An indium tin oxide (ITO) conductive glass was cleaned in the following sequences, the ITO conductive glass was respectively subjected to ultrasonic cleaning for 10 min in cleaning agent-added ethanol, cleaning agent-added ultrapure water, ultrapure water, acetone, and ethanol successively, and then blown-dried by nitrogen to obtain a clean conductive glass substrate, and the clean conductive glass substrate was subjected to UV-ozone treatment for 15 min.

5, 1 ml of $SnO_2$ was taken and diluted with ultrapure water into 2.67 wt %. 45 μL of the diluted $SnO_2$ was taken and dripped onto the ITO substrate, and the substrate was spin-coated by a spin coater at a rotating speed of 3000 r/min for 30 s to form a film, and then the ITO spin-coated with $SnO_2$ was annealed for 30 min at 150° C. The annealed ITO conductive substrate spin-coated with an electron transfer layer was placed onto a hot spin coater and preheated for 5 min.

6, 80 μL of the reacted perovskite precursor solution in the step 3 was taken and dripped onto the preheated ITO substrate, and spin-coated to form a film, and then annealed to form a perovskite film. The perovskite precursor solution was spin-coated at a rotating speed of 4000 r/min for 30 s, and annealed in dry air at 150° C. for 30 min.

7, 73.2 mg Spiro-MeOTAD were weighed and dissolved into 1 ml of a chlorobenzene solvent, then stirred and dissolved for 1 h, and added with 17.6 μL of lithium bis(trifluoromethylsulfonyl)imide dissolved into acetonitrile having a concentration of 520 mg/ml, stirred and dissolved for 1 h, and finally added with 28.8 μL of 4-tert-butylpyridine, stirred and dissolved for 1 h, to obtain a hole transport layer material, and the material was spin-coated onto the perovskite film by Spiro-MeOTAD at 3000 r/min for 30 s, to form a hole transport layer, and the hole transport layer was oxidized inair for 24 h.

Figure 3:
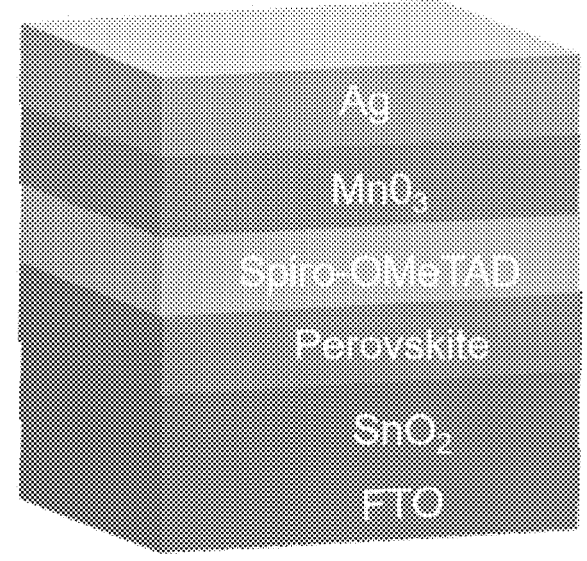
FIG. 3 is a diagram showing a structure of a perovskite device provided in the examples of the present disclosure.
Figure 4:
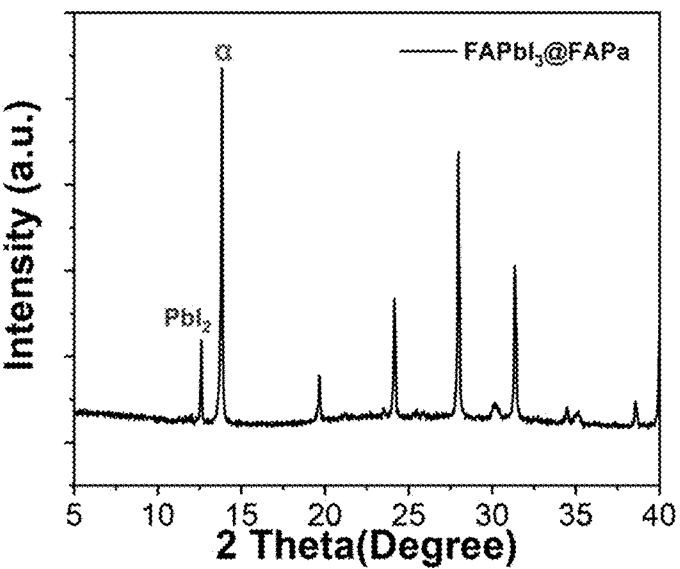
FIG. 4 shows an X-ray powder diffraction (XRD) pattern of a perovskite film provided in the examples of the present disclosure.
Figures 5, 6:
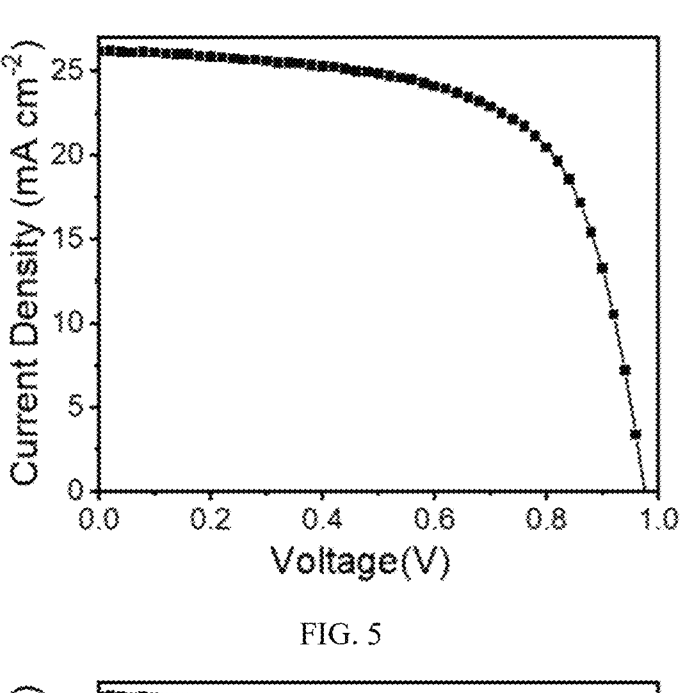
FIG. 5 shows a J-V curve graph of the perovskite device provided in Example 1 of the present disclosure.
FIG. 6 shows a J-V curve graph of a perovskite device provided in Example 2 of the present disclosure.

8, 5 nm $MoO_3$ was plated and then 100 nm metal electrode Ag was plated on the hole transport layer via vacuum evaporation to obtain a perovskite solar cell device, as shown in the structure diagram of FIG. 3. As shown in FIG. 4, a quite strong black phase $FAPbI_3$ perovskite could be obtained at 13.9°. As shown in FIGS. 5-6, under standard test conditions (illuminated at AM1.5G), the cell device prepared in the example has a powerconversion efficiency of 16.5%, an open-circuit voltage of 0.976 V, a short-circuit current density of 26.17 $mA/cm^2$, and a fillfactor of 64.66%.

Example 2

1, Sodium butyrate and formamidine hydrochloride were respectively added to a single-neck flask containing ethanol, and stirred at room temperature for 24 h to be dissolved completely, and then the completely dissolved formamidine hydrochloride was dropwise added to a single-neck flask containing sodium butyrate; the mixed solution in the single-neck flask was subjected to magnetic stirring at 25-60° C. for 24-36 h, and reaction was stopped.

2, The obtained reaction liquid was subjected to first filtration, and the filtered primary filtrate was subjected to rotary evaporation to remove the solvent ethanol, and then subjected to oscillating washing with acetone or benzene for 20-35 min, and the washed solution was subjected to secondary filtration to remove the excessive solid; the filtered secondary filtrate was subjected to rotary evaporation to remove the solvent acetone or benzene, to obtain the required formamidinium butyrate ionic liquid;

3, 291.33 mg lead iodide and 108.67 mg formamidine hydriodide were weighed and dissolved into 1 ml of a formamidinium butyrate ionic liquid solvent for reaction at 40° C. for 6 h.

4, An indium tin oxide (ITO) conductive glass was cleaned in the following sequences, the ITO conductive glass was respectively subjected to ultrasonic cleaning for 15 min in cleaning agent-added ethanol, cleaning agent-added ultrapure water, ultrapure water, acetone, and ethanol successively, and then blown-dried by nitrogen to obtain a clean conductive glass substrate, and the clean conductive glass substrate was subjected to ultraviolet ozonation for 20 min.

5, 1 ml of $SnO_2$ was taken and diluted with ultrapure water into 2.67 wt %. 45 μL of the diluted $SnO_2$ was taken and dripped onto the ITO substrate, and the substrate was spin-coated by a spin coater at a rotating speed of 3000 r/min for 30 s to form a film, and then the ITO spin-coated with $SnO_2$ was annealed for 30 min at 150° C. The annealed ITO conductive substrate spin-coated with an electron transfer layer was placed onto a hot spin coater and preheated for 5 min.

6, 80 μL of the reacted perovskite precursor solution was taken and dripped onto the preheated ITO substrate, and spin-coated to form a film, and then annealed to form a perovskite film. The perovskite precursor solution was spin-coated at a rotating speed of 4000 r/min for 30 s, and annealed in dry air at 150° C. for 30 min.

7, 3.2 mg Spiro-MeOTAD were weighed and completely dissolved into 1 ml of a chlorobenzene solvent, then stirred and dissolved for 1 h, and added with 17.6 L of lithium bis(trifluoromethylsulfonyl)imide dissolved into acetonitrile having a concentration of 520 mg/ml, stirred and dissolved for 1 h, and finally added with 28.8 μL of 4-tert-butylpyridine, stirred and dissolved for 1 h. The dissolved hole transport material was spin-coated onto the perovskite film by Spiro-MeOTAD at 3000 r/min for 30 s, to form a hole transport layer, and the hole transport layer was oxidized in the air for 24 h.

8, 5 nm $MoO_3$ was plated and then 100 nm metal electrode Au was plated on the hole transport layer via vacuum evaporation to obtain a perovskite solar cell device. Under standard test conditions (illuminated at AM1.5G), the cell device prepared in the example has an powerconversion efficiency of 15.47%, an open-circuit voltage of 0.958 V, a short-circuit current density of 25.98 $mA/cm^2$, and a fillfactor of 62.20%.

Obviously, the above examples are merely enumerated to specify the present disclosure clearly, but are not construed as limiting the embodiments of the present disclosure. Those skilled in the art could further make other different forms of changes or alterations on the basis of the above description. All the embodiments need and could not be enumerated exhaustively hereby. Obvious changes or alterations derived therefrom shall still fall within the protection scope of the present disclosure.

What is described above are merely partial embodiments of the present disclosure. It should be indicated that those skilled in the art could further make several improvements and embellishments without departing from the principle of the present disclosure. Moreover, these improvements and embellishments shall be deemed to be within the protection scope of the present disclosure.

What is claimed is:

1. A method for synthesizing a perovskite precursor solution of a formamidine-based ionic liquid, comprising:

adding an organic sodium salt and a formamidine hydrochloride to ethanol, respectively, stirring and dissolving to obtain a formamidine hydrochloride solution and a sodium alkyl carboxylate solution;

dropwise adding the formamidine hydrochloride solution to the sodium alkyl carboxylate solution, and stirring a mixed solution at 25-60° C. for reaction for 24-36 h;

filtering the reacted mixed solution and extracting a filtrate, performing rotary evaporation on an obtained primary filtrate to remove a solvent ethanol, and performing oscillating washing with an organic solvent for 25-35 min;

performing secondary filtration on a washed solution and extracting a filtrate; performing rotary evaporation on an obtained secondary filtrate to remove the organic solvent, to obtain an organic acid formamidine ionic liquid; and dissolving lead iodide and formamidine hydriodide into the organic acid formamidine ionic liquid for reaction for at least 5 h at 40-80° C. to obtain the perovskite precursor solution of a formamidine ionic liquid.

2. The method according to claim 1, wherein a molar ratio of the organic sodium salt to the formamidine hydrochloride is 1:1.5-2.5.

3. The method according to claim 1, further comprising: adding the obtained organic acid formamidine ionic liquid to ethanol for dissolving, removing the ethanol via rotary evaporation repeatedly to obtain a pure product formamidine alkylcarboxylate ionic liquid.

4. The method according to claim 1, further comprising: a molar ratio of a mixture of the organic sodium salt and the formamidine hydrochloride to the ethanol is 1:5-8.

5. The method according to claim 1, wherein the organic sodium salt is at least one of sodium alkyl carboxylate, sodium propionate, or sodium butyrate.

6. A method for preparing a perovskite solar cell device, comprising:

cleaning a conductive glass substrate, spin-coating an electron transport material onto the conductive glass substrate, and spin-coating the perovskite precursor solution of a formamidine-based ionic liquid obtained by the method of claim 1 onto an electron transfer layer of the conductive glass substrate, and annealing to form a formamidine-based perovskite film;

spin-coating a hole transport layer material onto the formamidine-based perovskite film to obtain a hole transport layer, and depositing a modified layer and a metal electrode onto the hole transport layer via vacuum evaporation.

7. The method according to claim 6, further comprising:

mixing $SnO_2$ with deionized water in a mass ratio of 1:3-7 to obtain an electron transfer layer material, a $SnO_2$ solution;

spin-coating the $SnO_2$ solution on a conductive substrate for 20-40 s at 3500-4500 r/min by a spin coater for film forming, and annealing at 120-180° C. for at least 30 min; and performing UV-ozone treatment on an annealed conductive substrate spin-coated with the electron transfer layer for at least 10 min.

8. The method according to claim 6, further comprising:

dissolving Spiro-OMeTAD into chlorobenzene, stirring and adding an acetonitrile solution of lithium bis(trifluoromethylsulfonyl)imide and 4-tert-butylpyridine to form the hole transport layer material; and spin-coating the hole transport layer material on a surface of an $FAPbI_3$ active layer at 3500-4500 r/min for 20-40 s for film forming, and performing oxidization in the air for at least 24 h.

9. The method according to claim 6, wherein the modified layer is $MoO_3$ having a thickness of 3-7 nm, and the metal electrode is Au or Ag having a thickness of 80-120 nm.

10. A solar cell, comprising a perovskite solar cell device, wherein the perovskite solar cell device is prepared by a method comprising:

cleaning a conductive glass substrate, spin-coating an electron transport material onto the conductive glass substrate, and spin-coating the perovskite precursor solution of a formamidine-based ionic liquid obtained by the method of claim 1 onto an electron transfer layer of the conductive glass substrate, and annealing to form a formamidine-based perovskite film;

spin-coating a hole transport layer material onto the formamidine-based perovskite film to obtain a hole transport layer, and depositing a modified layer and a metal electrode onto the hole transport layer via vacuum evaporation.

11. The solar cell according to claim 10, the method further comprising:

mixing $SnO_2$ with deionized water in a mass ratio of 1:3-7 to obtain an electron transfer layer material, a $SnO_2$ solution;

spin-coating the $SnO_2$ solution on a conductive substrate for 20-40 s at 3500-4500 r/min by a spin coater for film forming, and annealing at 120-180° C. for at least 30 min; and performing UV-ozone treatment on an annealed conductive substrate spin-coated with the electron transfer layer for at least 10 min.

12. The solar cell according to claim 10, the method further comprising:

dissolving Spiro-OMeTAD into chlorobenzene, stirring and adding an acetonitrile solution of lithium bis(trifluoromethylsulfonyl)imide and 4-tert-butylpyridine to form the hole transport layer material; and spin-coating the hole transport layer material on a surface of an $FAPbI_3$ active layer at 3500-4500 r/min for 20-40 s for film forming, and performing oxidization in the air for at least 24 h.

13. The solar cell according to claim 10, wherein the modified layer is $MoO_3$ having a thickness of 3-7 nm, and the metal electrode is Au or Ag having a thickness of 80-120 nm.

* * * * *